United States Patent

Heady et al.

[11] Patent Number: 5,991,153
[45] Date of Patent: Nov. 23, 1999

[54] HEAT TRANSFER SYSTEM AND METHOD FOR ELECTRONIC DISPLAYS

[75] Inventors: Gregory S. Heady; Steve J. Bendik, both of Phoenix, Ariz.

[73] Assignee: Lacerta Enterprises, Inc., Phoenix, Ariz.

[21] Appl. No.: 09/183,165

[22] Filed: Oct. 30, 1998

Related U.S. Application Data

[63] Continuation-in-part of application No. 08/960,525, Oct. 31, 1997.

[51] Int. Cl.$^6$ .................................................. H05K 7/20
[52] U.S. Cl. ........................ 361/704; 361/687; 361/695; 165/102.32; 165/185; 349/12
[58] Field of Search .................................... 361/682, 687, 361/692–698, 724, 683, 735; 165/104.14, 104.33, 104.34, 80.2, 80.3, 80.4, 104.32, 165, 185; 313/17, 22, 35, 44; 345/10, 87; 349/12, 58, 161

[56] References Cited

U.S. PATENT DOCUMENTS

| | | |
|---|---|---|
| 4,002,831 | 1/1977 | Aeschliman . |
| 4,134,624 | 1/1979 | Moyer . |
| 4,447,856 | 5/1984 | Takahashi et al. . |
| 4,528,614 | 7/1985 | Shariff et al. . |
| 4,644,408 | 2/1987 | Coleman . |
| 4,827,439 | 5/1989 | Licht . |
| 4,836,625 | 6/1989 | Catta . |
| 4,847,602 | 7/1989 | Altland et al. ........................... 361/682 |
| 4,935,845 | 6/1990 | Schwehr et al. . |
| 4,949,934 | 8/1990 | Krenz et al. . |
| 4,985,803 | 1/1991 | Pum et al. . |
| 5,091,827 | 2/1992 | Suret et al. . |
| 5,243,493 | 9/1993 | Jeng et al. . |
| 5,271,669 | 12/1993 | Pearlson . |
| 5,529,120 | 6/1996 | Howard et al. . |
| 5,536,079 | 7/1996 | Kostic . |
| 5,559,671 | 9/1996 | Dan et al. . |
| 5,573,317 | 11/1996 | Cavanauagh et al. . |
| 5,590,407 | 12/1996 | Ishikawa et al. . |
| 5,603,376 | 2/1997 | Hendrix ............................. 165/104.34 |
| 5,748,269 | 5/1998 | Harris et al. ............................. 349/58 |
| 5,872,699 | 2/1999 | Nishii et al. ............................ 361/699 |

FOREIGN PATENT DOCUMENTS

| | | | |
|---|---|---|---|
| 06202566 | 7/1994 | Japan ................................ G09F 9/00 |

*Primary Examiner*—Donald Sparks
*Assistant Examiner*—Michael Datskovsky
*Attorney, Agent, or Firm*—Schmeiser, Olsen & Watts

[57] ABSTRACT

An electronic display unit includes: 1) a sealed display housing; 2) an electronic display inside the display housing; 3) circuit boards inside the display housing; 4) a heat collector inside the display housing; 5) a heat dissipater outside the display housing; and 6) a thermally conductive link between the heat collector and the heat dissipater. Various apparatus and methods allow gathering heat inside the display housing and transferring heat either to outside the display housing or to the electronic display inside the display housing. The transfer occurs without exposing electronic components inside the display housing to dust and moisture. Thus, exposure of the electronic components to excessive heat is avoided and exposure of the electronic display to excessive cold is also avoided. The electronic display, along with the circuit board, are positioned to at least partially define a front chamber, a center chamber, and a rear chamber. Also, a front and rear fan set are positioned to circulate air among the chambers to accomplish the indicated effects.

20 Claims, 6 Drawing Sheets

HEAT TRANSFER SYSTEM AND METHOD FOR ELECTRONIC DISPLAYS

RELATED APPLICATION

This application is a continuation-in-part of the earlier patent application by Heady et al. entitled "METHOD AND APPARATUS FOR DISSIPATING HEAT FROM AN ELECTRONIC DISPLAY", Ser. No. 08/960,525, filed Oct. 31, 1997, which is incorporated herein by reference.

BACKGROUND OF THE INVENTION

1. Technical Field

This invention relates to the field of equipment housings for outdoor communication structures. More specifically the invention relates to an apparatus for protecting equipment in a walk-up or drive-in ordering apparatus and a method for maximizing heat transfer from an electronic display housing.

2. Background Art

One of the services that modern businesses offer with increasing frequency is the ability to transact business while remaining in an automobile or at a walk-up structure. Consumers find such services appealing because of the convenience and efficiency with which they can complete tasks such as purchasing goods, arranging for services, conducting bank transactions, and paying bills. Drive-in or walk-up ordering is commonly associated with fast-food restaurants and dry-cleaning businesses. However, these transactions may also occur at banks or other establishments where feasible.

The outdoor communication structures currently used by walk-up or drive-in businesses also have certain disadvantages. Because such structures are generally placed in an outdoor location and require some sort of communication link with a person or computer, exposure to adverse weather conditions, communication quality, and vandalism are often significant concerns. Very little, if any, patented technology exists for solving these problems with outdoor communication structures. However, a few patents exist that relate generally to the types of equipment often found in such structures. Some of these references include U.S. Pat. No. 4,002,831 issued to Aeschliman, U.S. Pat. No. 4,447,856 issued to Takahashi et al., U.S. Pat. No. 4,836,625 issued to Catta, U.S. Pat. No. 4,985,803 issued to Pum et al., U.S. Pat. No. 5,243,493 issued to Jeng et al., and U.S. Pat. No. 5,529,120 issued to Howard et al. The teachings of the indicated references do not adequately overcome the problems associated with outdoor communication structures and, more specifically, drive-in ordering apparatus which comprise one subgroup of outdoor communication structures.

A common concern with outdoor communication structures is their exposure to adverse weather conditions. Drive-in ordering apparatus are often positioned remotely with respect to the main business building and cannot receive the benefits of climate control and other protection from heat, wind, dust, and moisture. Remote positioning of a drive-in apparatus is a characteristic choice, for example, with fast-food restaurants where a driveway provides a controlled route for automobiles to approach an ordering apparatus. After placing an order, customers then proceed to a window at the main business building where they pay for and pick up their order. Remote positioning has the advantage of allowing restaurants to improve efficiency by preparing a customer's order while they wait in a line of automobiles to pay for and pick up their order. Other outdoor communication structures may be embedded within an outside facing wall of a building and may or may not be able to receive the benefits of climate control from the building. Even if climate control is possible, the equipment housed in the outdoor communication structure is still potentially exposed to adverse weather conditions.

Among the weather conditions listed above, heat, wind, and dust are particularly troublesome because few conventional equipment housings provide effective protection, particularly in arid or semi-arid climates. A common solution to equipment overheating inside a housing is to provide a fan along with intake and exhaust vents. This arrangement will probably cool the equipment, but at the cost of increased interference with communication, electricity usage, maintenance of fans, and intake of dust and moisture. Ordering apparatus typically have an intercom system with a microphone and speaker that allows customers and business personnel to communicate with each other. Accordingly, the vibration from a fan is transmitted to the intercom microphone and, thus, decreases the coherence of communication to and from the customer. Such interference is in addition to the already troublesome vibration from automobiles, pattering from rain, hissing from wind, and other sources. Also, because a fan continuously intakes and exhausts air, any dust or moisture in the air will be drawn into the housing where it can interfere with equipment such as speakers and/or microphones, fans, lights, and possibly electronic displays.

The above problems are increasingly more troublesome as more businesses begin to install relatively valuable equipment, such as liquid crystal displays, electroluminescent displays, and field emission displays. Electronic displays such as those listed enhance the communication between customers and business personnel, but they are susceptible to heat, dust, and moisture damage. Not only are displays subject to overheating from sun exposure, but they also generate heat during normal operation that must be dissipated. Currently, electronic displays endure a shortened operation life because of incessant exposure either to heat from the sun or self-generated heat or both. There also exists a paradox that as more effort is made to encase displays and protect them from dust and moisture, heat exposure increases because the encasing prevents proper dissipation of heat.

Thus, it can be seen from the above discussion that it would be an improvement in the art to provide outdoor communication structures having a housing that simultaneously protects equipment from heat, moisture, and dust. Unless better protection is provided, businesses will continue to lose profits from equipment malfunctions that require costly repair and turn away inconvenienced customers.

DISCLOSURE OF INVENTION

According to the present invention, an electronic display unit is provided comprising: 1) a sealed display housing; 2) an electronic display at least partially inside the display housing; 3) at least one circuit board inside the display housing having a plurality of electronic components; 4) at least one heat collector inside the display housing; 5) at least one heat dissipater at least partially outside the display housing; and 6) a thermally conductive link between the heat collector and the heat dissipater. Thus, excessive heat inside the display housing is transferred outside the display housing without exposing the electronic components to dust and moisture from outside the display housing.

By way of example, the electronic display may be wholly inside the display housing and the electronic display, along with the circuit board, may be positioned to at least partially define a front chamber, a center chamber, and a rear chamber. Further, a front fan set may be positioned to circulate air from the center chamber to the front chamber and then back to the center chamber and a rear fan set may be positioned to circulate air from the center chamber to the rear chamber and then back to the center chamber. Such a front fan set may be activated by a fan controller, that includes a temperature sensor, to warm overly cold locations inside the display housing with heat generated in the center chamber. In particular, the electronic display may be warmed when cold. In addition, both the rear fan set and the front fan set may be activated by the fan controller to circulate hot air to the rear chamber where it may be transferred through a heat collector to outside the display housing and a heat dissipater. For example, the heat collector and the heat dissipater may be metallic fins designed to collect and dissipate heat primarily by convection. Additional heat collectors may also be provided that are metallic plates collecting heat primarily by conduction through thermal links with selected heat generating electronic components. Also for example, the present invention may transfer heat accumulated from incident sun radiation in the front chamber to the aforementioned heat dissipaters.

Also, according to the present invention, a method for transferring heat from an electronic display unit is provided comprising the steps of: establishing a thermally conductive link between at least one heat collector inside a display housing and at least one heat dissipater at least partially outside the display housing; providing an electronic display at least partially inside the display housing; providing at least one circuit board inside the display housing having a plurality of electronic components; sealing the display housing from dust and moisture outside of the display housing; and transferring excessive heat from the heat collector to the heat dissipater outside the display housing.

By way of example, additional steps may be executed to transfer heat from the electronic display unit, wherein air is circulated selectively through chambers defined by circuit boards and the display housing. By arranging fan units and the chamber dividers in keeping with the present invention, the interior of the sealed display housing may be kept sufficiently cool despite heat generated by electronic components and heat accumulated from sun exposure.

Further, an electronic display unit according to the present invention is provided comprising: 1) a sealed display housing; 2) an electronic display at least partially inside the display housing; 3) at least one circuit board inside the display housing having a plurality of electronic components; and 4) a heat distribution means for gathering heat inside the display housing and selectively transferring heat either to outside the display housing or to the electronic display without exposing the electronic components to dust and moisture from outside the display housing, wherein exposure of the electronic components to excessive heat is avoided and exposure of the electronic display to excessive cold is also avoided.

The foregoing and other features and advantages of the present invention will be apparent from the following more particular description of preferred embodiments of the invention, as illustrated in the accompanying drawings.

BRIEF DESCRIPTION OF DRAWINGS

Preferred embodiments of the present invention will hereinafter be described in conjunction with the appended drawings, where like designations denote like elements, and.

BEST MODE FOR CARRYING OUT THE INVENTION

Figure 1:
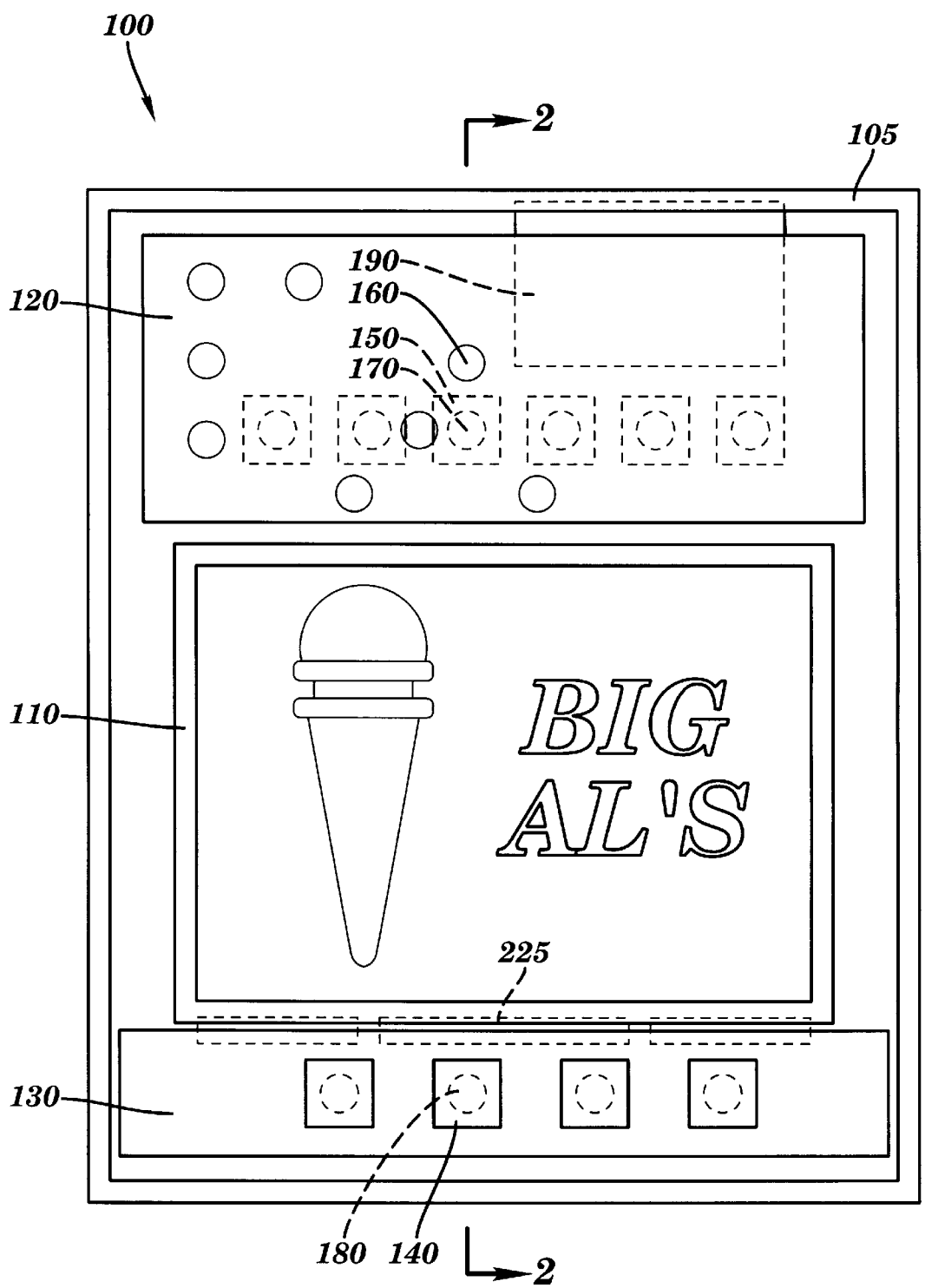
FIG. 1 is a front view of a display unit according to a preferred embodiment of the present invention.

According to a preferred embodiment of the present invention, various apparatus and methods are provided for gathering heat inside a display housing, as described herein, and selectively transferring heat either to outside the display housing or to an electronic display inside the display housing. The transfer occurs without exposing electronic components inside the display housing, including the electronic display, to dust and moisture from outside the display housing. Thus, exposure of the electronic components to excessive heat is avoided and exposure of the electronic display to excessive cold is also avoided. In one preferred embodiment, an electronic display unit is provided comprising: 1) a sealed display housing; 2) an electronic display at least partially inside the display housing; 3) at least one circuit board inside the display housing having a plurality of electronic components; 4) at least one heat collector inside the display housing; 5) at least one heat dissipater at least partially outside the display housing; and 6) a thermally conductive link between the heat collector and the heat dissipater. Thus, excessive heat inside the display housing is transferred outside the display housing without exposing the electronic components to dust and moisture from outside the display housing.

It is preferred that the electronic display is wholly inside the display housing and the electronic display, along with the circuit board, are positioned to at least partially define a front chamber, a center chamber, and a rear chamber. Further, it is more preferred that a front fan set is positioned to circulate air from the center chamber to the front chamber and then back to the center chamber and a rear fan set is positioned to circulate air from the center chamber to the rear chamber and then back to the center chamber. Most preferably, such a front fan set may be activated by a fan controller, that includes a temperature sensor, to warm overly cold locations inside the display housing with heat generated in the center chamber. In particular, the electronic display may be warmed when cold. In addition, both the rear fan set and the front fan set may be activated by the fan controller to circulate hot air to the rear chamber where it may be transferred through a heat collector to outside the display housing and a heat dissipater. It is also preferred that the heat collector and the heat dissipater are metallic fins designed to collect and dissipate heat primarily by convection. Additional heat collectors may also be provided that are metallic plates collecting heat primarily by conduction through thermal links with selected heat generating electronic components. Also, in a more preferred embodiment, the present invention may transfer heat accumulated from incident sun radiation in the front chamber to the aforementioned heat dissipaters.

According to another preferred embodiment of the present invention, a method for transferring heat from an electronic display unit is provided comprising the steps of: establishing a thermally conductive link between at least one heat collector inside a display housing and at least one heat dissipater at least partially outside the display housing; providing an electronic display at least partially inside the display housing; providing at least one circuit board inside the display housing having a plurality of electronic components; sealing the display housing from dust and moisture outside of the display housing; and transferring excessive heat from the heat collector to the heat dissipater outside the display housing.

In a more preferred embodiment, additional steps may be executed to transfer heat from the electronic display unit, wherein air is circulated selectively through chambers defined by circuit boards and the display housing. By arranging fan units and the chamber dividers in keeping with the present invention, the interior of the sealed display housing may be kept sufficiently cool despite heat generated by electronic components and heat accumulated from sun exposure.

Referring to the figures, FIG. 1 shows a front view of a display unit 100 with a face plate 205 (shown in FIG. 2) removed, according to a preferred embodiment of the present invention. As shown in FIG. 1, display unit 100 includes a display housing 105, an electronic display 110, an upper circuit board 120, and a lower circuit board 130. FIG. 1 also shows a front fan 140 positioned on the front of lower circuit board 130 in a set of four such fans. Also, front intake 180 is shown formed through lower circuit board 130 behind front fan 140 and each such fan in the set of front fans. Front intake 180 allows front fan 140 when activated to withdraw air from behind lower circuit board 130 and blow it upward in front of electronic display 110. Front exhaust 160 is shown formed through upper circuit board 120 so that the air blown upward in front of electronic display 110 by front fan 140 will pass through front exhaust 160 to the chamber behind upper circuit board 120. Several additional front exhausts are also shown formed through upper circuit board 120. FIG. 1 further shows the position of rear fan 150 and rear intake 170 behind upper circuit board 120 with respect to the other elements of display unit 100. Rear fan 180 is shown in a set of similar fans mounted on a circuit board which is not shown in FIG. 1 but may be viewed in FIGS. 2 through 4. A heat sink 190 is further shown in FIG. 1, appearing behind upper circuit board 120 and embedded partially into the upper wall of display housing 105. Also, the relative position of rear exhaust 225 with respect to rear fan 150 and rear intake 180 is shown in FIG. 1.

When face plate 205 not shown in FIG. 1 is secured in place on display housing 105, a display window 207 (shown in FIG. 2) will allow viewing of electronic display 110, while generally obscuring view of the other elements of display unit 100 shown in FIG. 1. At least, such is the case when display housing 105 and face plate 205, other than display window 207, are fabricated from a material such as metal, aluminum or plastic that is not transparent. Alternatively, display housing 105 or face plate 205 may be fabricated from materials such as transparent plastic, in which case, no display window 207 is necessary. Other considerations, discussed in more detail below, must be given when selecting a material such as plastic for display housing 105, since plastic is a poor thermal conductor. FIG. 1 shows elements that are helpful in practicing the present invention but leaves out several elements that are nevertheless needed to operate display unit 100. The elements not shown are discussed generically herein. For example, various electronic components are needed on upper circuit 120 and/or lower circuit board 130 to operate electronic display 110, front fan 140, rear fan 150, etc. The selection and arrangement of such electronic components and, perhaps, other components may be selected by those skilled in the art to provide a functional display unit 100. Specifically, selection of such components will to some extent depend upon the particular type of use in which display unit 100 will be engaged.

Figure 2:
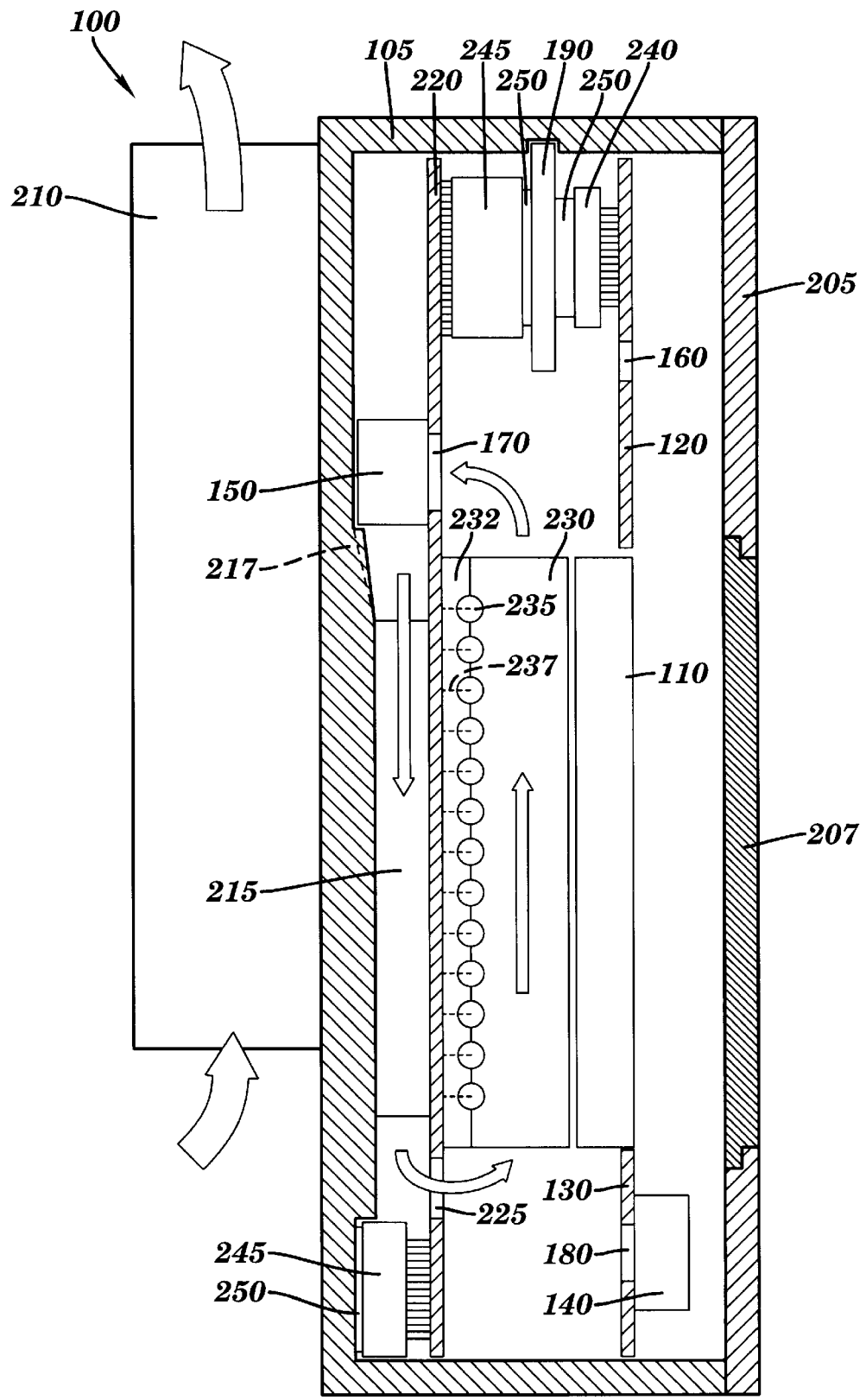
FIGS. 2–4 are each a cross-sectional view of the display unit in FIG. 1 taken along lines 2—2.

Turning now to FIG. 2, additional elements of display unit 100 are shown in a cross-sectional view of the display unit in FIG. 1 taken along line 2—2. Accordingly, FIG. 2 again shows display housing 105, except with face plate 205 secured in place on the front of display housing 105. Also, a transparent display window 207 is shown pressed in place into face plate 205. Securing face plate 205 to display housing 105 and display window 207 to face plate 205 should be done in a manner so as to seal display housing 105 from air and moisture penetration. Accordingly, the components inside display unit 100 may be isolated from the environment surrounding display unit 100, allowing long term operation without the need to replace or repair various components. However, because display unit 100 is sealed, it may be very difficult, if not impossible in some circumstances, for any heat generated by the internal components of display unit 100 to escape. Accordingly, heat may easily accumulate inside display unit 100 to the point that an excessive heat condition is reached, damaging the very components which allow display unit 100 to operate.

In the earlier patent application of which the present application is a continuation-in-part, a method and apparatus were described for dissipating heat from an electronic display. The earlier application primarily discusses the concept of sizing display housing 105 such that surface area is maximized for a minimum volume, wherein heat transfer is thus maximized due to the maximized surface area. The present invention may be practiced in conjunction with the invention that is the subjection of the earlier patent application. However, the present invention in intended to enhance the transfer of heat from inside display unit 100 to the outside beyond that amount possible through the invention of the earlier application.

FIG. 2 further shows external fins 210 secured to the back of display housing 105. External fins 210 are secured to display housing 105 in a manner such that a thermally conductive link exists between external fins 220 and internal fins 215 shown inside display housing 105. If display housing 105 is fabricated from heat conductive metal, in particular aluminum, then a suitable link will be established simply by juxtaposing external fins 210 against display housing 105 and juxtaposing internal fins 215 against an opposing wall inside display housing 105, as shown in FIG. 2. To increase the conductivity between external fins 210 and internal fins 215 a thermal grease, heat conductive tape, or other thermally conductive substance may be applied between display housing 105 and external fins 210 or internal fins 215. Also, internal fins 215 and external fins 210 may be formed unitary to display housing 105. Such would be the case if they were machined from a single section of aluminum. However, unitary construction is not required.

The thermal link between internal fins 215 and external fins 210 allows internal fins 215 to act as a heat collector, gathering excessive heat inside display housing 105 for transfer to external fins 210, which are adapted to act as a heat dissipater. That is, the large surface area of external fins 210 provides an improved heat transfer surface for dissipating heat to the surroundings of display unit 100. In particular, air may be blown through external fins 210, as shown by the arrows at the bottom and top of external fins 210 in FIG. 2 indicating upward air flow, in keeping with the description in the earlier patent application of which this application is a continuation-in-part. If display housing 105 is fabricated from other than thermally conductive metal or aluminum, then it may be necessary to somehow thermally link external fins 210 to internal fins 215. Any such linking known to those skilled in the art may be used, however, it may include drilling holes through display housing 105 to connect internal fins 215 to external fins 210 with metal studs or another heat conductor. Such linking may even include forming internal and external fins as a unitary assembly apart from display housing 105.

Figures 5, 6:
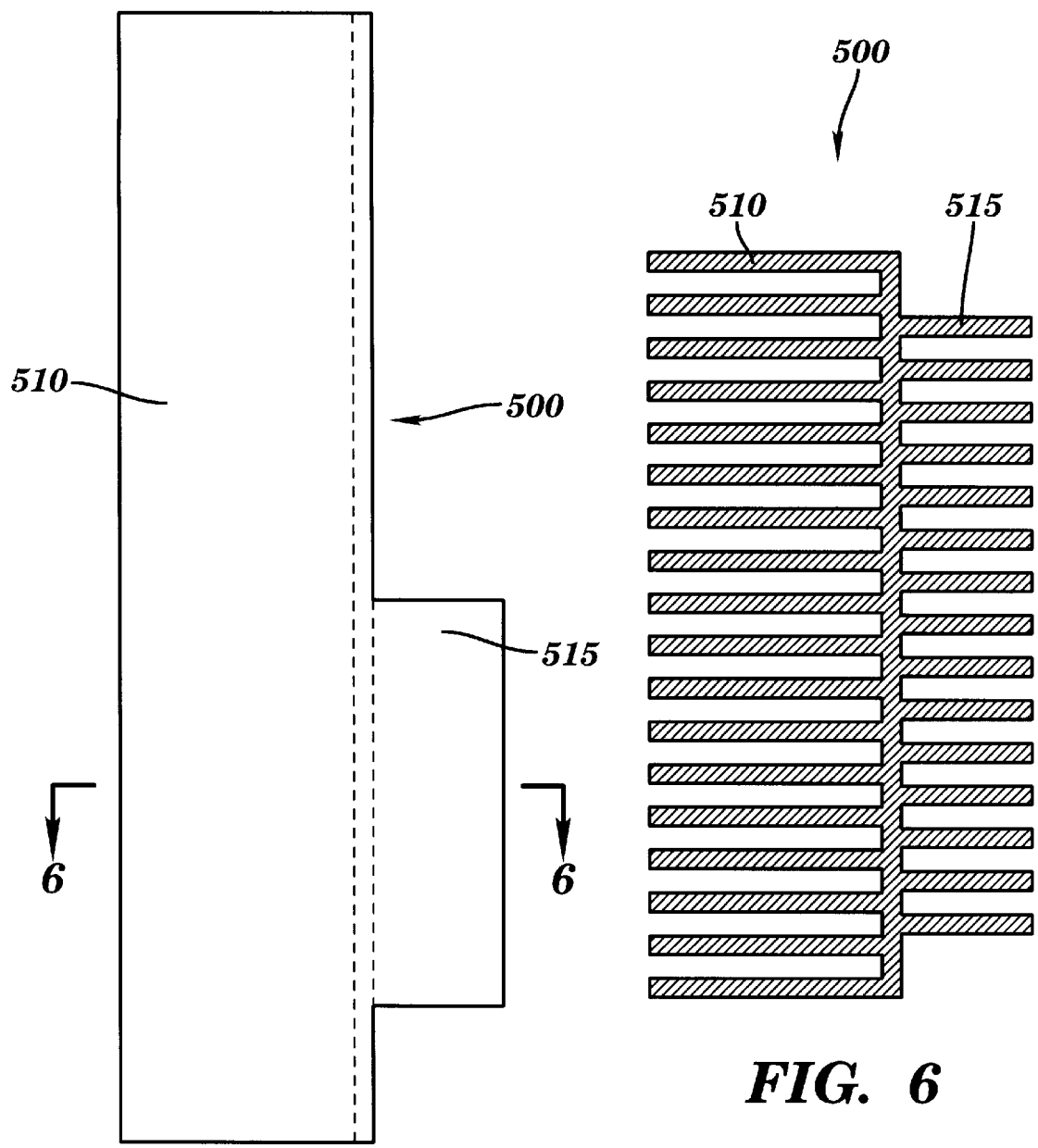
FIG. 5 is side view of a double fin assembly according to an alternative preferred embodiment of the present invention according.
FIG. 6 is a cross-sectional view of the double fin assembly in FIG. 5 taken along lines 6—6.

An example of one possible unitary assembly for external fins 210 and internal fins 215 is shown in FIGS. 5 and 6. FIG. 5 shows a side view of a double fin assembly according to an alternative preferred embodiment of a heat collector and dissipater. FIG. 6 shows a cross-sectional view of the double fin assembly in FIG. 5 taken along lines 6—6. Double fin assembly 500 includes multiple external fins 510 joined as a single unit with multiple internal fins 515. The dimensions of double fin assembly 500, in particular external fins 510 and internal fins 515, must be adapted to the particular dimensions used for display housing 105. Generally, an opening (not shown) would be formed in the rear of display housing 105 wherein internal fins 515 may be inserted. Accordingly, it is preferred that double fin assembly 500 be shaped to allow a suitable seal between display housing 105 and double fin assembly 500. One of the several possible suitable designs is shown in FIGS. 5 and 6 which will still yield a display housing sealed from dust and moisture.

Returning to FIG. 2, electronic display 110, upper circuit board 120 and lower circuit board 130 are shown positioned so as to partition off a front chamber between face plate 205 and the aforementioned three elements. Also, rear circuit board 220 is shown positioned to partition off a center chamber between rear circuit board 220 and the combination of upper circuit board 120, electronic display 110, and lower circuit board 130. Further, rear circuit board 220 also forms a rear chamber between rear circuit board 220 and the rear of display housing 105. Although the arrangement of elements shown in FIG. 2 is the preferred arrangement to yield a front chamber, center chamber, and rear chamber, other alternatives for chamber locations are within the scope of the present invention.

Figure 3:
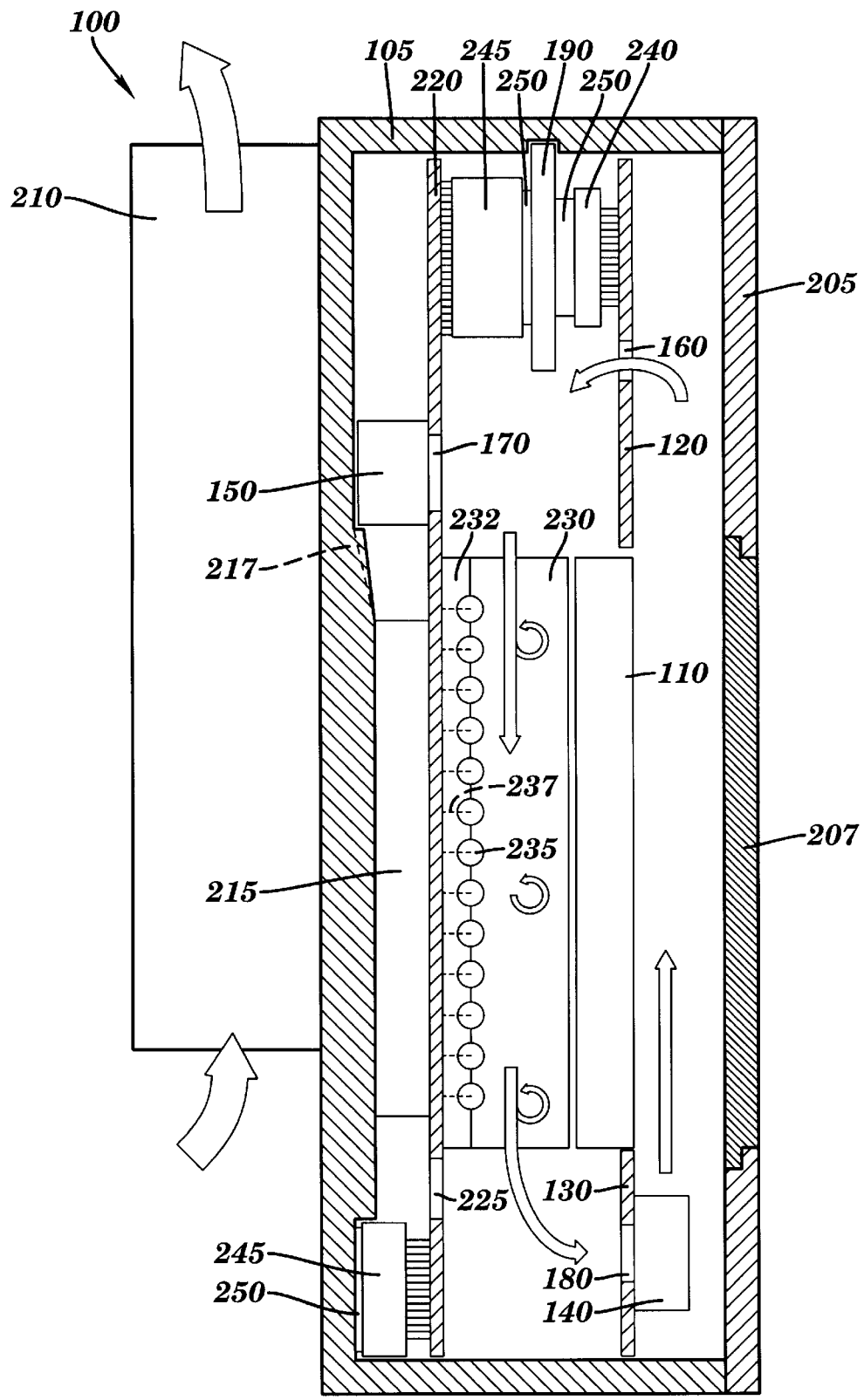
Figure 4:
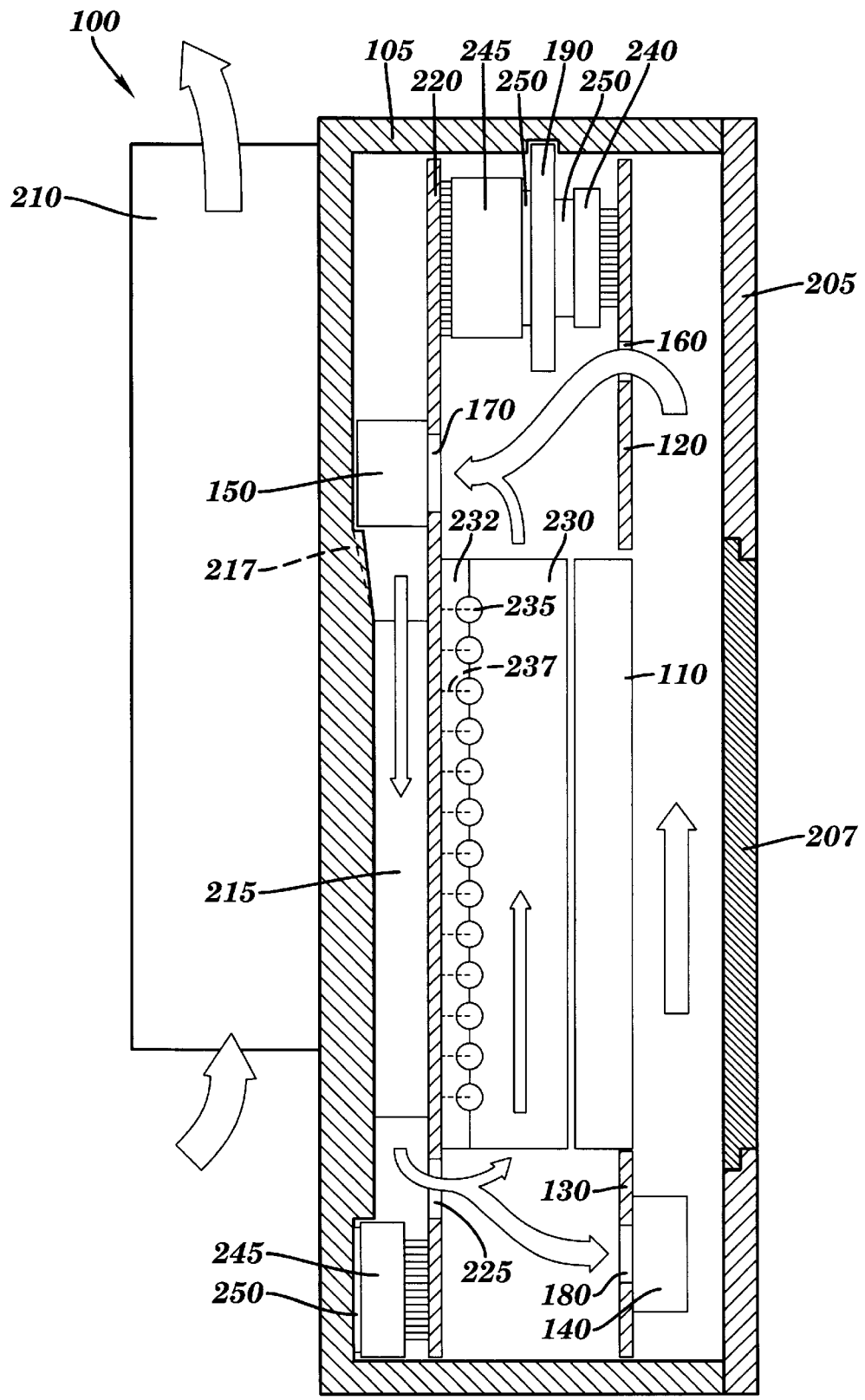

Essentially, it is an advantage of the present invention that air may be circulated through various chambers in a manner such that heat is moved from areas of higher concentration to internal fins 215, or another heat collector, where the heat can be transferred to outside display housing 105. FIGS. 2 through 4 describe three air flow scenarios that may be induced inside display unit 100. In FIG. 2, rear fan 150 is activated to withdraw air from the center chamber through rear intake 170 and push air downward through internal fins 215, then out rear exhaust 225 and back into the center chamber. Accordingly, air is circulated from the center chamber to the rear chamber and back to the center chamber. This circulation follows the expected movement of heated air through display housing 105. That is, several backlighting lamps 235 are positioned in the center chamber to better illuminate images shown in electronic display 110, wherein backlighting lamps 235 are electrically and mechanically connected to rear circuit board 220. The electrical and mechanical connection is accomplished by lamp leads 237 at each end of each lamp soldered to rear circuit board 220 or otherwise attached thereto. Backlighting lamps 235 generate heat during operation which tends to rise. Also, as air flowing through internal fins 215 is cooled, it will tend to sink. Accordingly, rear fan 150 encourages such flow pattern by taking in hot air from above backlighting lamps 235, forcing it through internal fins 215, thereby cooling the air, and returning cooled air beneath backlighting lamps 235 through rear exhaust 225. Such a flow pattern is indicated in FIG. 2.

FIG. 2 also shows a side view of channeling 217 which aids in guiding air flow from rear fan 150 between the fins of internal fins 215. Essentially, such channeling comprises groves in the surface of display housing 105 near the outlet from rear fan 150, wherein the depth of the groves gradually decreases as they approach internal fins 215. It is an advantage of channeling 217 that bulk air flow exiting from rear fan 150 is guided between internal fins 215. Notably, even though only one rear fan 150 is described as being activated, any number of the six rear fans shown in FIG. 1 may be activated. In addition, fewer fans or more fans may be provided depending upon the cooling needs and desired flow characteristics desired for a particular display unit 100.

FIG. 3 shows an alternative air flow scenario, wherein front fan 140 is activated to withdraw air from the center chamber and push air upwards in front of electronic display 110 in the front chamber. The air flow then passes through front exhaust 160 and is drawn downward by the activated front fan 140. Even though only one front fan is described as being activated, any number of the four front fans shown in FIG. 1 may be activated. In addition, fewer fans or more fans may be provided depending upon the cooling needs and desired air flow characteristics desired for a particular display unit 100. It is an advantage of the FIG. 3 flow scenario that electronic display 110 may be warmed by heat generated from backlighting lamps 235 when display unit 100 is in cold conditions. Since electronic display 110 is viewed through display window 207, radiant heat loss is possible through the same display window 207. Accordingly, electronic display is more likely to be affected by cold conditions than other elements. Such a flow scenario may even be used to prevent frost from accumulating on the outside of display window 207. Because the downward air flow shown in the center chamber is against the flow which would be expected with heat rising from backlighting lamps 235, turbulence and eddies will tend to appear in the flow scenario. However, such swirling patterns assist in warming the back side of electronic display 110 and also help to gather heat better from backlighting lamps 235 for transport to the front chamber.

Referring now to FIG. 4, a third air flow scenario is shown in which both rear fan 150 and front fan 140 are activated. As discussed earlier, any portion of the several fans located in the set of fans with rear fan 150 or front fan 140 may be activated to control air flow in a manner alternative to that shown in FIG. 4. Such alternate flow scenarios are within the scope of the present invention and may accomplish some of the advantages of the three flow scenarios set forth herein when combined with the principles of the present invention. Essentially, it is an advantage of the third air flow scenario shown in FIG. 4 that heat accumulated in the front chamber from incident sun radiation may be transported to the rear chamber, along with heat generated in the center chamber, for collection by internal fins 215 and transfer to external fins 210.

Because six rear fans are provided and only four front fans are provided, the flow of air through the front chamber will be approximately double the flow of air through the center chamber when all fans are activated. That is, the six rear fans 150 operating simultaneously will direct a predetermined volume of air out of rear exhaust 225 and into the center chamber. Of that total volume entering the center chamber, approximately two-thirds will be withdrawn from the center chamber by the four front fans 140 and directed through the front chamber. Thus, of the volume output from rear exhaust 245 approximately two-thirds will pass through the front chamber and approximately one-third will pass through the center chamber. In other words, twice as much volume passes through the front chamber. The air passing through the front chamber will reenter the center chamber through front exhaust 160 and join the rising air flow in the center chamber, carrying with it the heat generated by backlighting lamps 235, and enter the six rear fans 150 through rear intake 170. While the heat generated in the center chamber is being withdrawn and routed through internal fins 215, the heat accumulated in the front chamber through incident sun radiation will also be transported to the rear chamber for collection and transfer to a dissipater, such as external fins 210. Since the distribution of air flow between the front and center chamber is determined by the number of activated front fans 140 and rear fans 150, changing the number of activated fans may also change the air flow distribution. However, this is advantageous to account for varying conditions of heat generation and incident sun radiation through display window 237. In addition, FIG. 1 shows various passageways through which air may flow, such as front exhaust 160 and gaps between upper circuit board 120, electronic display 110, display housing 105. Accordingly, depending upon actual flow scenarios desired, it may be helpful to block certain passages to achieve an optimum cooling or heating effect on the elements within display unit 100.

In addition to not showing the electronic components that operate electronic display 110, the figures also do not show the electronic components needed to provide fan controllers as described above. In other words, a preferred embodiment to the present invention also includes a fan controller, including multiple electronic components, on circuit boards such as upper circuit board 160, lower circuit board 130, and/or rear circuit board 220. Suitable fan controllers may be any presently known to those skilled in the art. Such a fan controller preferably includes at least one temperature sensor inside display housing 105. Preferably, multiple temperature sensors are provided for measuring temperature, in particular, in the front chamber and on the back of display housing 105, since it is the temperature in these areas that is of primary concern. The front chamber temperature indicates the extent of heat accumulation from sunlight and the display housing temperature indicates the efficiency of heat dissipation, in accordance with well-known heat transfer principles.

Accordingly, the fan controller (not shown) may be programmed to activate at least a portion of the set of front fans 140 when temperature is within a first range, such as below 32 degrees Fahrenheit (° F.), wherein damage to electronic display 110 may occur due to cold exposure. Also, the fan controller may activate at least a portion of the set of rear fans 150 when temperature is within a second range, such as 120 to 130° F., to transport heat generated in the center chamber to the rear chamber for collection and transfer outside display unit 100. Finally, the fan controller may activate at least a portion of each fan set when temperature is within a third range, such as above 130° F., to transport both heat generated in the center chamber and heat accumulated in the front chamber to the rear chamber for collection and transfer. Further, the type and limitations of electronic components within display housing 105 may vary depending on the type of application in which it is used. Thus, the temperatures described above for activation of the fans may also vary to best protect different electronic components from cold exposure or overheating.

Figure 7:
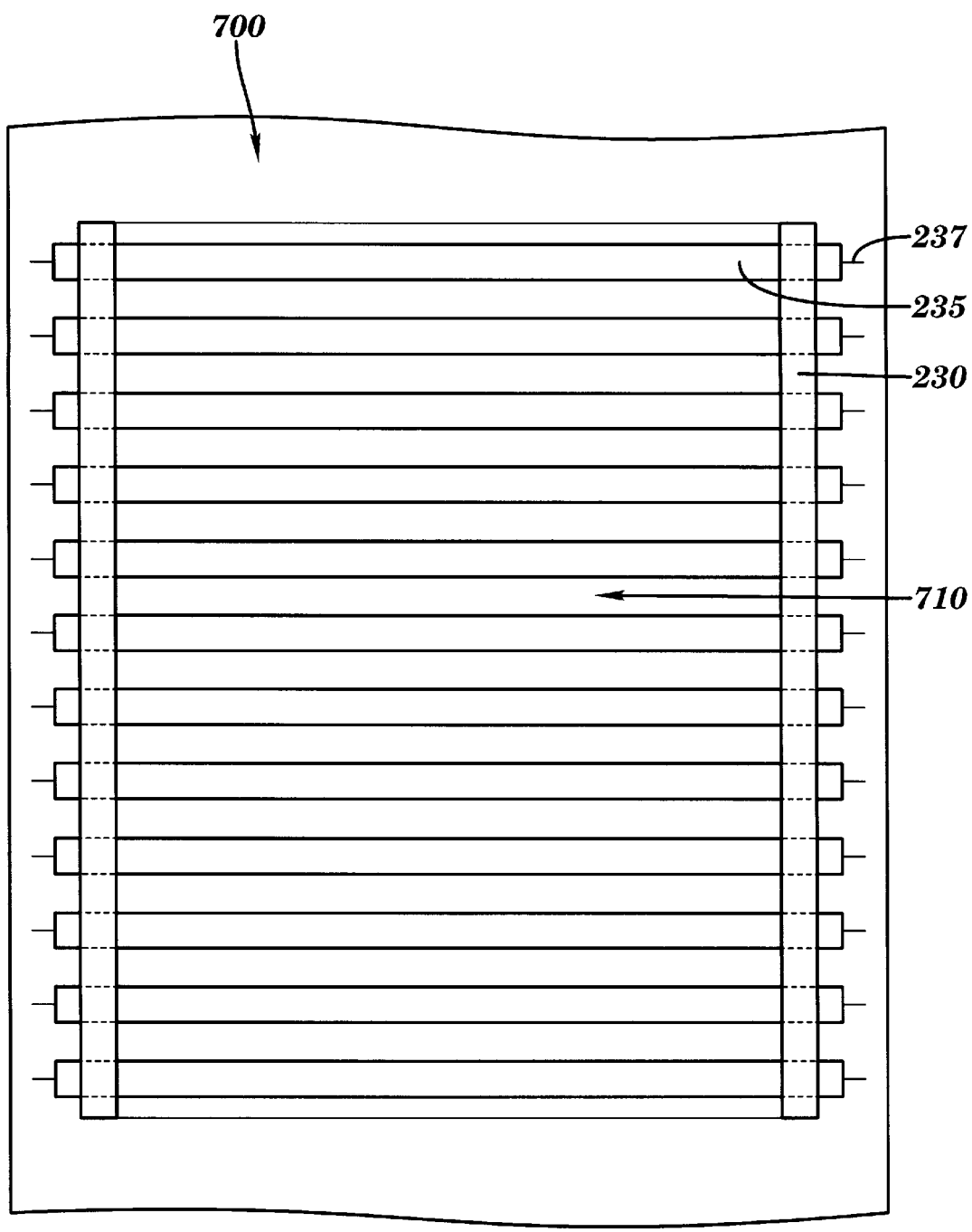
FIG. 7 is a front view of a backlighting lamp assembly according to a preferred embodiment of the present invention.

In another preferred embodiment of the present invention additional structural elements of display housing 105 may help to transport excessive heat outside of display unit 100 or to warm electronic display 1 0. In particular, as shown in FIGS. 2–4 and 7, backlighting lamps 235 are mounted in thermally conductive lamp end brackets including a front portion 230 and a rear portion 232. In FIG. 7, two lamp end brackets 230, 232 are shown for mounting each end of each backlighting lamp 235. Among the several types of possible lamps which may be used in display housings, cold cathode fluorescent lamps (CFL) are preferred. For CFLs, the ends are the hottest part of the lamp and the temperature of the lamp ends is one factor determining the brightness of the CFL radiant output. Accordingly, lamp end brackets 230, 232 have a dual function. First, heat generated at the lamp ends is collected by thermally conductive lamp end brackets 230, 232 to provide an increased surface area to transfer heat to an air flow through the center chamber. Second, thermally conductive lamp end brackets 230, 232 approximately evenly distribute heat collected from each lamp among all lamps, thereby automatically adjusting the temperature of each lamp end to be approximately the same. The automatic adjustment of lamp end temperature means that lamp brightness will also be approximately even among backlighting lamps 235.

Generally, for CFLs, a temperature difference between lamps of 10° F. will not provide a significantly different level of brightness. However a larger temperature difference may create a noticeably different illumination level, thus the lamp end brackets should be clearly adequate to distribute heat evenly enough to provide consistent illumination. Even so, the top and bottom backlighting lamps are only bordered on one side by a neighboring lamp, accordingly, their temperature will be slightly less. Nevertheless, many of the suitable electronic displays that may be used in display housing 105 are provided with edge lights at the top and bottom edges of electronic display 110. Backlighting lamps 235 may be positioned in lamp end brackets 230, 232 such that edge lights in electronic display 110 help to transfer heat to the top and bottom backlighting lamps. Thus, a more even distribution of tube brightness may be obtained.

Although not shown in FIGS. 2–4, FIG. 7 shows a backlighting lamp assembly 700 that includes reflector 710, in addition to backlighting lamps 235 and lamp end brackets 230, 232. The lamp end bracket is split with rear half 232 and front half 230 to provide easy installation and removal of backlighting lamps 235 as necessary. Accordingly, backlighting lamps 235 may be mounted tightly in lamp end brackets 230, 232 and yet be exchanged as needed by splitting the brackets. Further, backlighting lamps 235 are shown arranged in a horizontal position, however the CFLs could also be arranged vertically, as may be needed when a larger electronic display is used to span the distance across its viewing screen. If CFLs are arranged vertically, then it may be necessary to provide air flow holes (not shown) through lamp end brackets 230, 232 such that heat exchange can still occur as described above. In conventional backlighting lamp assemblies, no such lamp end brackets are used. Rather, only a simple reflector is placed behind backlighting lamps to assist in even illumination of electronic display 110. Although not shown, illumination detectors may also be provided in a preferred embodiment of the present invention to control the illumination level of backlighting lamps 235. The illumination can be varied depending upon several factors, such as time of day, temperature, and even the extent of incident sun radiation, to provide readily viewable images in electronic display 110.

In addition to the heat collectors and distributors described above, another heat collector is show in FIGS. 2–4 as heat sink 190. Essentially heat sink 190 is a metallic plate that collects heat primarily by conduction through a thermal link 250 with selected heat generating components, such as electronic component 240 and power supply 245. Notably, electronic component 240 is connected by electrical leads to upper circuit board 160 and power supply 245 above backlighting lamps 235 is similarly electrically connected to rear circuit board 220 while power supply 245 below internal fins 215 is also electrically connected to rear circuit board 220. However, electronic component 240 and power supply 245 above backlighting lamps 235 are connected by thermal links 250 to heat sink 190. By comparison, power supply 245 is connected directly to display housing 105 by thermal link 250. Accordingly, display housing 105, depending upon its material of construction, may also comprise a heat collector, as do heat sink 190 and internal fins 215.

Heat sink 190 is further thermally connected to display housing 105 in a groove that is filled with thermal grease for better heat conduction. The groove attachment in display housing 105 also allows heat sink 190 to comprise an important structural support, whereby fewer mounting devices will be required to adequately secure the various circuit boards and other components within display housing 105. Although the thermal connection to power supply 245 is possible, it is not necessarily as significant as the thermal connection with electronic component 240, such as a central processing unit. Conventional heat sinks for central processing units have a relatively large profile compared to heat sink 190 and take up sometime critical volume in some designs for display unit 100. Heat sink 190 is shown as a flat plate, however the plate could be shaped differently. For example, heat sink 190 could allow different heights of electronic components on a circuit board to be contacted to heat sink 190 for collection and transfer of heat to display housing 105.

One of the troubles that may be encountered with manufacturing a sealed display housing, as shown in the accompanying figures, is that air sealed within the unit may need to be dry. Conventionally, ports are provided in other types of sealed apparatus to evacuate the apparatus and fill it with desiccated air, so that no moisture will build up inside the apparatus. However, in accordance with a preferred embodiment of the present invention, solid desiccant may be placed inside display housing 105 to collect any moisture in the air sealed inside display housing 105. Preferably, enough desiccant is provided to dry more than the interior volume of display housing 105. Specifically, an amount of desiccant rated for ten times the interior volume has been found more than adequate. Accordingly, unless equipment replacement or repair inside the display housing is required, the unit may remain sealed and protected from environmental conditions such a moisture and dust.

While the invention has been particularly shown and described with reference to preferred embodiments thereof, it will be understood by those skilled in the art that various changes in form and details may be made therein without departing from the spirit and scope of the invention. Accordingly, unless otherwise specified, any dimensions of the apparatus indicated in the drawings or herein are given as an example of possible dimensions and not as a limitation. Similarly, unless otherwise specified, any sequence of steps of the method indicated in the drawings or herein are given as an example of a possible sequence and not as a limitation. For example, it will be understood that, while various of the conductors (connections) are shown in the drawing as single lines, they are not so shown in a limiting sense, and may comprise plural conductor (connections), as is understood in the art.

We claim:

1. An electronic display unit comprising:

a sealed display housing;

an electronic display at least partially inside the display housing;

at least one circuit board inside the display housing, said at least one circuit board having a plurality of electronic components;

at least one heat collector inside the display housing;

at least one heat dissipater at least partially outside the display housing;

a thermally conductive link between the heat collector and the heat dissipater;

at least three chambers inside the display housing; and a plurality of fan sets inside the display housing, each fan set comprising at least one fan, wherein a first fan set is positioned to circulate air from a second chamber to a first chamber and back to the second chamber, wherein a second fan set is positioned to circulate air from the second chamber to a third chamber and back to the second chamber, and wherein excessive heat inside the display housing is transferred outside the display housing without exposing the electronic components to dust and moisture from outside the display housing.

2. The electronic display unit of claim 1, wherein the at least three chambers and the plurality of fan sets are positioned and controlled to move heat from areas of higher concentration to selectively cool overheated locations or warm overly cold locations.

3. An electronic display unit comprising:

a sealed display housing;

an electronic display at least partially inside the display housing;

at least one circuit board inside the display housing, said at least one circuit board having a plurality of electronic components;

a plurality of backlighting lamps mounted in metallic lamp end brackets that are oriented about lamp ends to approximately evenly distribute heat among the lamp ends;

at least one heat collector inside the display housing;

at least one heat dissipater at least partially outside the display housing; and a thermally conductive link between the heat collector and the heat dissipater, wherein excessive heat inside the display housing is transferred outside the display housing without exposing the electronic components to dust and moisture from outside the display housing.

4. The electronic display unit of claim 1, wherein the at least one heat collector comprises a plurality of heat collectors including at least one of each of the following:

a set of metallic fins collecting heat primarily by convection; and a metallic plate collecting heat primarily by conduction through thermal links with selected heat generating electronic components.

5. The electronic display unit of claim 1, wherein the at least one heat dissipater comprises metallic fins and the display housing.

6. The electronic display unit of claim 1, wherein the display housing comprises a transparent display window and a material selected from among metal, aluminum, plastic, and transparent plastic.

7. The electronic display unit of claim 6, comprising:
a plastic display housing; and
a metal double fin assembly as both a heat collector and a heat dissipater.

8. The electronic display unit of claim 1, wherein the electronic display is wholly inside the display housing, wherein the at least three chambers comprise three chambers, and wherein the electronic display and the at least one circuit board are positioned to at least partially define the first chamber as a front chamber, the second chamber as a center chamber, and the third chamber as a rear chamber.

9. The electronic display unit of claim 8, wherein:
the front chamber comprises a portion of the display housing between the display housing and the electronic display;
the center chamber comprises a portion of the display housing between the electronic display and at least one rear circuit board; and
the rear chamber comprises a portion of the display housing between the at least one rear circuit board and the display housing.

10. The electronic display unit of claim 3, wherein the plurality of backlighting lamps are positioned in the center chamber.

11. The electronic display unit of claim 9, wherein the first fan set comprises a front fan set, wherein the second fan set comprises a rear fan set, and wherein, in addition to transferring excessive heat outside the display housing, overly cold locations inside the display housing may be warmed in the absence of excessive heat.

12. The electronic display unit of claim 11, further comprising a fan controller having at least one temperature sensor, wherein the fan controller activates at least a portion of the front fan set when temperature is within a first range, at least a portion of the rear fan set when temperature is within a second range, and at least a portion of each fan set when temperature is within a third range.

13. The electronic display unit of claim 12, wherein the first range is below 32° F., the second range is 120 to 130° F., and the third range is above 130° F.

14. A method for transferring heat from an electronic display unit comprising the steps of:
establishing a thermally conductive link between at least one heat collector inside a display housing and at least one heat dissipater at least partially outside the display housing;
providing an electronic display at least partially inside the display housing;
providing at least one circuit board inside the display housing, said at least one circuit board having a plurality of electronic components;
providing at least three chambers inside the display housing;
providing a plurality of fan sets inside the display housing, each fan set comprising at least one fan, wherein a first fan set is positioned to circulate air from a second chamber to a first chamber and back to the second chamber and wherein a second fan set is positioned to circulate air from the second chamber to a third chamber and back to the second chamber;
sealing the display housing from dust and moisture outside the display housing; and
moving heat from areas of higher concentration using at least one fan set to selectively cool overheated locations or warm overly cold locations.

15. The method of claim 14, further comprising the step of approximately evenly distributing heat among ends of a plurality of backlighting lamps by using metallic lamp end brackets that are oriented about lamp ends to approximately evenly distribute heat among the lamp ends.

16. The method of claim 14, wherein the step of moving heat further comprises collecting heat from selected heat generating electronic components with a metallic plate that is thermally linked to the electronic components and to the display housing.

17. The method of claim 14, wherein the step of moving heat further comprises collecting heat with metallic fins that are thermally linked to metallic fins outside the display housing.

18. The method of claim 14, wherein the steps of providing the electronic display and the at least one circuit board comprise positioning the electronic display and a plurality of circuit boards inside the display housing to at least partially define the first chamber as a front chamber between the display housing and the electronic display, the second chamber as a center chamber between the electronic display and at least one rear circuit board, and the third chamber as a rear chamber between the at least one rear circuit board and the display housing, the step of moving heat further comprising the steps of:
circulating air from the center chamber to the front chamber and then back when a temperature inside the display housing is within a first range, wherein overly cold locations inside the display housing are warmed in the absence of overheated locations;
circulating air from the center chamber to the rear chamber and then back when the temperature inside the display housing is within a second range; and
circulating air from the center chamber to the front and rear chamber and then back when the temperature inside the display housing is within a third range.

19. The method of claim 18, wherein:
the step of circulating air when temperature is within the first range comprises transporting heat generated by backlighting lamps in the center chamber to the front chamber, warming the electronic display;
the step of circulating air when temperature is within the second range comprises transporting heat generated by backlighting lamps in the center chamber to at least one heat collector positioned in the rear chamber; and
the step of circulating air when temperature is within the third range comprises transporting heat generated in the center chamber and heat accumulated in the front chamber from incident sun radiation to at least one heat collector positioned in the rear chamber.

20. An electronic display unit comprising:
a sealed display housing;
an electronic display at least partially inside the display housing;
at least one circuit board inside the display housing, said at least one circuit board having a plurality of electronic components; and
a plurality of heat transport means inside the display housing for moving heat from areas of higher concentration to selectively cool overheated locations or warm overly cold locations without exposing the electronic components to dust and moisture from outside the display housing.

* * * * *